(12) United States Patent
Im et al.

(10) Patent No.: US 7,082,068 B2
(45) Date of Patent: Jul. 25, 2006

(54) SEMICONDUCTOR MEMORY DEVICE AND METHOD FOR ADJUSTING INTERNAL VOLTAGE THEREOF

(75) Inventors: Jae-Hyuk Im, Ichon-shi (KR); Kee-Teok Park, Ichon-shi (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 47 days.

(21) Appl. No.: 11/000,083

(22) Filed: Dec. 1, 2004

(65) Prior Publication Data

US 2005/0270868 A1  Dec. 8, 2005

(30) Foreign Application Priority Data

Jun. 3, 2004  (KR) .................. 10-2004-0040321

(51) Int. Cl.
*G11C 7/00* (2006.01)
(52) U.S. Cl. ...................... 365/201; 365/196
(58) Field of Classification Search ............. 365/201, 365/205, 207, 196
See application file for complete search history.

(56) References Cited

U.S. PATENT DOCUMENTS

| | | | |
|---|---|---|---|
| 5,544,108 A * | 8/1996 | Thomann .................. | 365/201 |
| 5,949,723 A | 9/1999 | Clemen et al. | |
| 6,330,697 B1 | 12/2001 | Clinton et al. | |
| 6,623,992 B1 | 9/2003 | Haehn et al. | |
| 6,864,693 B1 | 3/2005 | Kondo et al. | |
| 6,906,945 B1 * | 6/2005 | Madan ...................... | 365/145 |
| 6,980,476 B1 * | 12/2005 | Do ............................ | 365/201 |
| 6,996,018 B1 * | 2/2006 | Yun ........................... | 365/205 |

FOREIGN PATENT DOCUMENTS

| | | |
|---|---|---|
| JP | 2002-118232 A | 4/2002 |
| JP | 2003-167030 A | 6/2003 |

* cited by examiner

*Primary Examiner*—Anh Phung
(74) *Attorney, Agent, or Firm*—McDermott Will & Emery LLP

(57) ABSTRACT

A semiconductor memory device improves test reliability by suppressing unnecessary leakage component in a USMC test which checks if data is normally transferred by extending a time margin between an active signal input time and a bit line sensing time. The semiconductor memory device includes at least one inner voltage adjusting unit for adjusting an inner voltage for limiting leakage portion that is generated in the semiconductor memory device during the USMC test by using a USMC signal for starting the USMC test and a termination signal for terminating the USMC test. The inner voltage adjusting unit includes a bulk bias voltage adjusting unit for supplying a bulk bias voltage to a cell transistor in the semiconductor memory device.

25 Claims, 6 Drawing Sheets

SEMICONDUCTOR MEMORY DEVICE AND METHOD FOR ADJUSTING INTERNAL VOLTAGE THEREOF

FIELD OF INVENTION

The present invention relates to a semiconductor memory device; and, more particularly, to an apparatus for improving reliability of a USMC(Unlimited Sensing Margin Control) test of a semiconductor memory device and a method thereof.

DESCRIPTION OF PRIOR ART

In general operation of a semiconductor memory device, when a word line is made to be active, a bit line sense amplifier senses a level of a bit line signal by charge-sharing on the bit line based on data that is stored in the cell coupled to the active word line in a predetermined time. That is, the conduction is not maintained for so long time without charge-sharing on the bit line based on data that is stored in the cell coupled to the active word line. However, as the semiconductor memory device is used in the course of time, its probability of malfunction increases. Therefore, semiconductor memory device manufacturers carry out a predetermined test for checking whether data is normally transferred or not by intentionally extending a time margin between an active signal input time and the bit line sensing time than the normal operation case. This is referred to as a USMC (Unlimited Sensing Margin Control) test, hereinafter.

In this test, the semiconductor memory device that has more leakage current portion on the bit line than a predetermined value may sense wrong data. From this, the semiconductor memory device that can guarantee normal operation for a predetermined time can be determined.

However, because a threshold voltage Vt of a transistor in the semiconductor memory device is decreased as the semiconductor memory device has a higher speed, the leakage current portion on the bit line is increased, which leads reliability problem for the USMC test result.

The USMC test described above is for checking if there is excessive leakage current on the bit line. The process for the USMC test is as follows. First, any one of word lines is made to be active. Then, it is checked if data that is outputted from the cell is transferred through the bit line as it should by detecting the level of the bit line after a predetermined time.

Referring to FIG. 1, there is a schematic diagram showing a cell array of the semiconductor memory device, which is divided into the cell array for storing data and a peripheral part for controlling the cell array. It will be described in detail for the USMC test with reference to FIG. 1.

The cell array includes capacitors C1, C2, C3, . . . for storing data, cell transistors T1, T2, T3, . . . for acting as switches, word lines WL1, WL2, WL3, . . . for controlling gate voltages of the cell transistors T1, T2, T3, . . . , bit lines BL, BL/ for acting as paths for data that is outputted from the capacitors C1, C2, C3, . . . through the cell transistors T1, T2, T3, . . . to a sense amplifier 230 and data that is stored to the capacitors C1, C2, C3, . . . through the cell transistors T1, T2, T3, . . . from the sense amplifier 230, the sense amplifier 230 for detecting the levels of the bit lines BL, BL/, and a bit line equalizing unit for equalizing the levels of the bit line and the bit line-bar BL, BL/ by using a bit line equalization signal BLEQ.

For example, when the word line WL1 goes to "H" state to turn on the transistor T1, data in the capacitor C1 is sensed through the bit line. In this case, some portion of charge in the capacitor C1 is transferred to the bit line through the cell transistor T1, which should not make potential change on the bit line-bar but some potential change on the bit line. However, as the threshold voltages of the cell transistors are reduced, leakage current is generated at the cell transistors T2, T3 that should be off, which leads charge is leaked from the capacitors that are coupled to those transistors to affect the potential on the bit line BL and the bit line-bar BL/. Such a leakage portion has a non-negligible effect on the USMC test as the semiconductor memory device has a higher speed and is highly integrated. In other words, because the leakage portion that is generated when the cell transistors that are not related to the USMC test are turned off and the leakage portion that is generated by the transistor in the sense amplifier is increased, the USMC test cannot be performed accurately, which affects the reliability of the USMC test.

FIG. 2 is a circuit diagram for a USMC test in prior art in which a bulk bias voltage VBB generator 240 of a cell transistor does not use a USMC signal USMC for the USMC test, and a termination signal term. That is, the bulk bias voltage VBB generator that is provided in the substrate of the cell transistor exists separately from a USMC logic circuit 210. Accordingly, the level of the bulk bias voltage VBB is not changed depending on the test mode. Here, the bulk bias voltage VBB is a voltage that is inputted into the substrate of the cell transistor.

First, it will be described for the detailed operation of the USMC logic circuit 210 in prior art as shown in FIG. 3.

The active signal atv in FIG. 3 is a word line signal that has a transition from a "L" level to a "H" level when a row address is inputted into the semiconductor memory device from an external device or a word line is to be selected to refresh the state of data that is stored at the capacitor. That is, the active signal atv does high-transition when the word line signal is made to be active. The USMC signal USMC is a signal for starting the USMC test. That is, when the USMC signal has a transition to the "H" state, the USMC test is started. The termination signal term is a signal for terminating the USMC test. When the term signal has a transition to the "H" state, the sense amplifier operates to start detecting the level of the bit line signal.

Referring to FIG. 3, in the normal operation, both of the USMC signal USMC and the termination signal term are in the "L" state so as to transfer the active signal atv as a sense amplifier active signal sa_atv. That is, in the normal operation, when the word line signal is made to be active, the sense amplifier operates accordingly.

On the other hand, when the USMC signal has a transition to the "H" state for the USMC test, an output of a NOR gate N1 has the "L" state regardless of the state of the active signal atv, but an output of a NOR gate N2 has the "H" state because the termination signal term is not yet active. Consequently, the sense amplifier active signal sa_atv automatically has the "L" state as the USMC signal USMC has a transition to the "H" state. When the termination signal term is made to be active to the "H" state for detecting the level of the bit line after a predetermined time, the output of the NOR gate N2 goes to the "L" state regardless of the USMC signal USMC and the active signal atv, and the final output, the sense amplifier active signal sa_atv, goes to the "H" state to start detection of the sense amplifier.

FIG. 4 is an exemplary diagram showing one embodiment of a generator for an RTO signal and an SB signal.

The generator 220 for the RTO signal and the SB signal receives the sense amplifier active signal sa_atv and the bit line equalization signal bleq. The bit line equalization signal bleq is a signal for pre-charging the bit line and the bit line-bar when the bit line sense amplifier blsa does not sense and is further applied to the generator 220 for the RTO signal and the SB signal to pre-charge the RTO signal and the SB signal to the Vblp level.

That is, when active, because the bit line equalization signal bleq is in the "L" state, the RTO signal output and the SB signal output are separated from each other. When pre-charge, the bit line equalization signal bleq goes to the "H" state so as to turn on the transistor that receives the bit line equalization signal bleq to its gate, which makes the RTO signal output and the SB signal output pre-charged to the Vblp.

When the sense amplifier active signal sa_atv goes to the "H" state, the high data level of the cell Vcore is applied to the RTO signal output and the low data level of the cell Vss is applied to the SB signal output.

In the USMC test, because it is active, the bit line equalization signal bleq goes to the "L" state to separate the RTO signal output from the SB signal output, but the voltage level of the bit line is not detected because the sense amplifier active signal sa_atv is in the "L" state for a predetermined time. After a while, when the termination signal term is inputted, the sense amplifier active signal sa_atv goes again to the "H" state so as to detect the voltage level of the bit line.

Next, it will be described for the operation of the VBB generator 240 in prior art as shown in FIG. 5.

Serially-coupled PMOS transistors P1 to P4 function as resistors. Here, the PMOS transistors P1, P2 that receive the fixed voltage VSS at their gates function as a fixed resistor, and the PMOS transistors P3, P4 that receive the bulk bias voltage VBB function as a variable resistor. That is, as the level of the bulk bias voltage goes down, the resistance of the PMOS transistors P3, P4 is decreased. To the contrary, as the level of the bulk bias voltage VBB arises, the resistance of the PMOS transistor P3, P4 is increased.

On the other hand, the power voltage VCC is an arbitrary high voltage power that is used for voltage division of the PMOS transistors P1 to P4. By adjusting the resistance of the PMOS transistors P3, P4, the power voltage VCC is made to have a value to let the input signal of the inverter INV1 be capable of controlling the operation of a voltage pump VBB_PUMP. That is, when the bulk bias voltage VBB is higher than a target value, the input of the inverter INV1 is made to go to the "H" state. When the bulk bias voltage VBB arrives at the target value, the input of the inverter INV1 is made to go to the "L" state. Therefore, when the bulk bias voltage VBB is higher than the target value, the input signal bb_en of the voltage pump VBB_PUMP goes to the "H" state so that the voltage pump VBB_PUMP can operate.

When the bulk bias voltage VBB decreases to the target value depending on the operation of the voltage pump VBB_PUMP, the gate inputs of the PMOS transistors P3, P4 decreases so as to make the resistance of the PMOS transistors be reduced. Accordingly, the input of the inverter INV1 goes to the "L" state so as to make the input signal bb_en of the voltage pump VBB_PUMP the "L" state, which stops the operation of the voltage pump VBB_PUMP.

When the level of the bulk bias voltage VBB goes again up, the resistance of the PMOS transistors P3, P4 increases and, accordingly, the input of the inverter INV1 goes to the "H" state to perform pumping operation for decreasing the bulk bias voltage VBB.

As described above, because the conventional voltage pump operates only when the bulk bias voltage VBB is higher than a predetermined value, it is not effective for suppressing leakage current of the cell transistors in the USMC test.

SUMMARY OF INVENTION

It is, therefore, an object of the present invention to provide a semiconductor memory device for improving test reliability by suppressing unnecessary leakage component in a USMC test.

In accordance with an aspect of the present invention, there is provided a semiconductor memory device for improving reliability of a USMC(Unlimited Sensing Margin Control) test, comprising at least one inner voltage adjusting unit for adjusting an inner voltage for limiting leakage portion that is generated in the semiconductor memory device during the USMC test by using a USMC signal for starting the USMC test and a termination signal for terminating the USMC test.

In accordance with another aspect of the present invention, there is provided a method for adjusting an inner voltage in a semiconductor memory device for improving reliability of a USMC(Unlimited Sensing Margin Control) test, comprising the steps of a) generating a control signal by using a USMC signal for starting the USMC test and a termination signal for terminating the USMC test; and b) adjusting the inner voltage under control of the control signal to limit leakage portion that is generated in the semiconductor memory device during the USMC test.

BRIEF DESCRIPTION OF THE DRAWINGS

The above and other objects and features of the present invention will become apparent from the following description of preferred embodiments taken in conjunction with the accompanying drawings, in which.

DETAILED DESCRIPTION OF INVENTION

Hereinafter, a data output control circuit for use in a semiconductor memory device in accordance with the present invention will be described in detail referring to the accompanying drawings.

Figure 1:
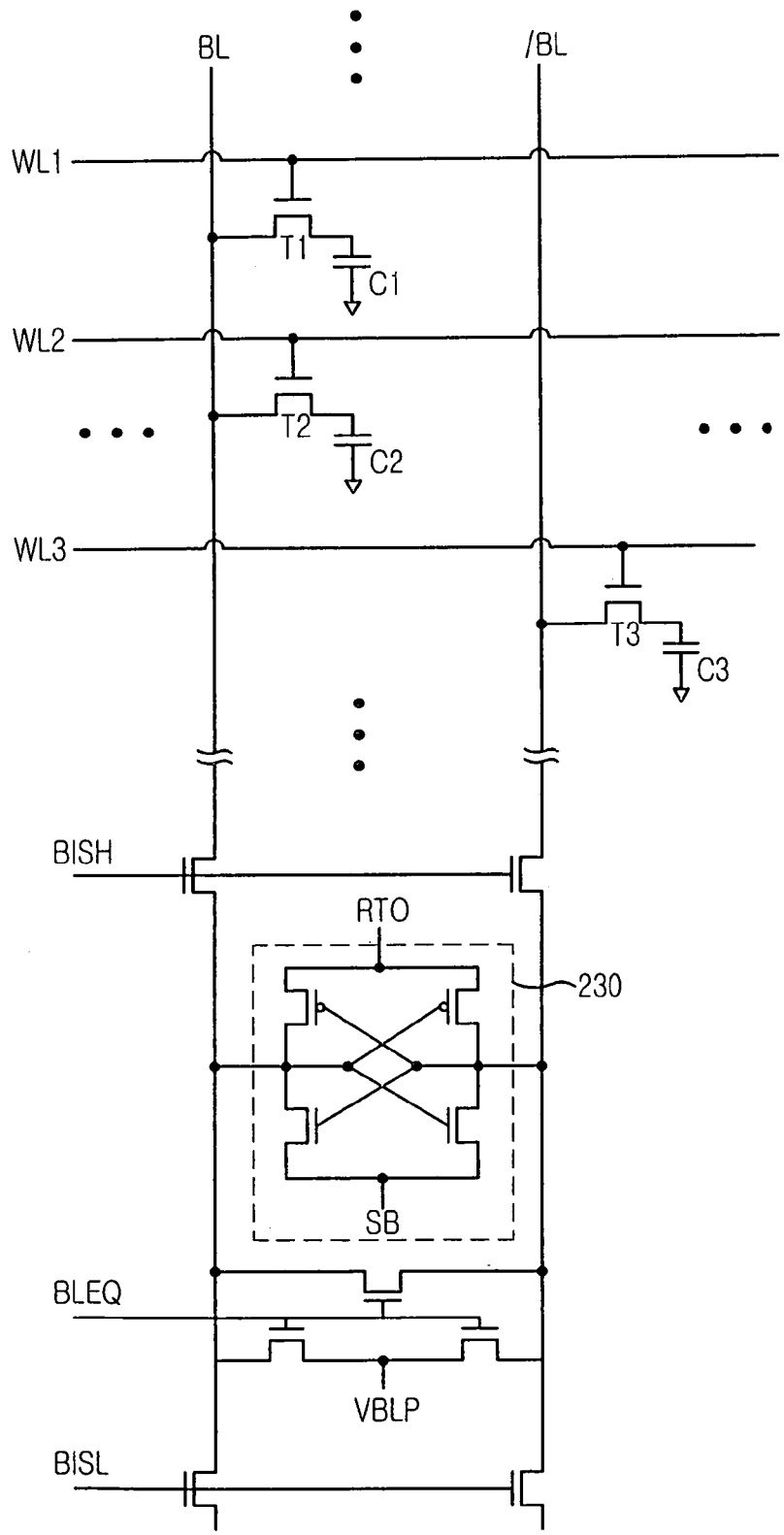
FIG. 1 is a schematic diagram showing a cell array in a semiconductor memory device.
Figure 2:
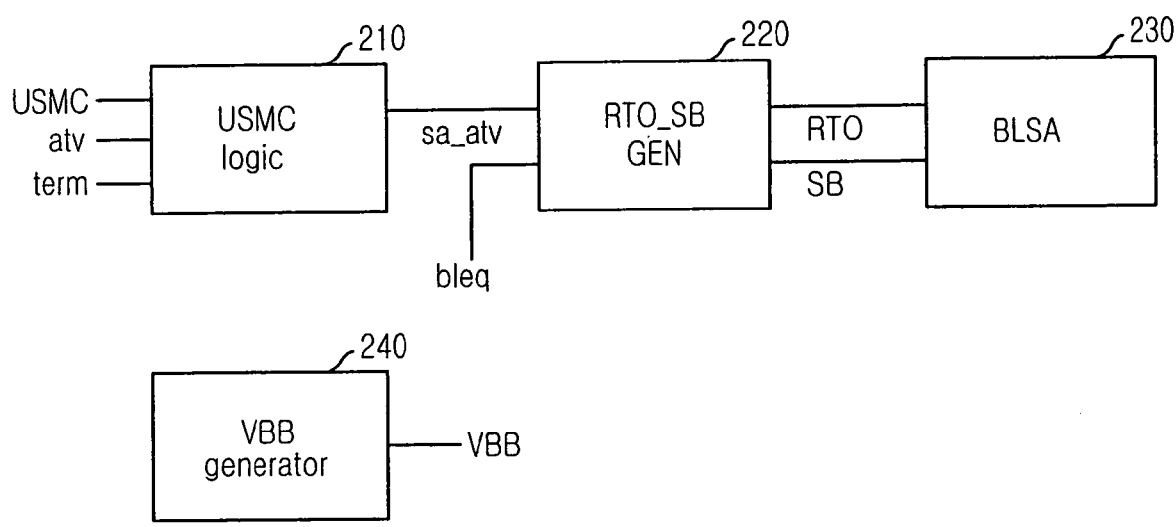
FIG. 2 is a circuit diagram for a USMC test in prior art.
Figure 3:
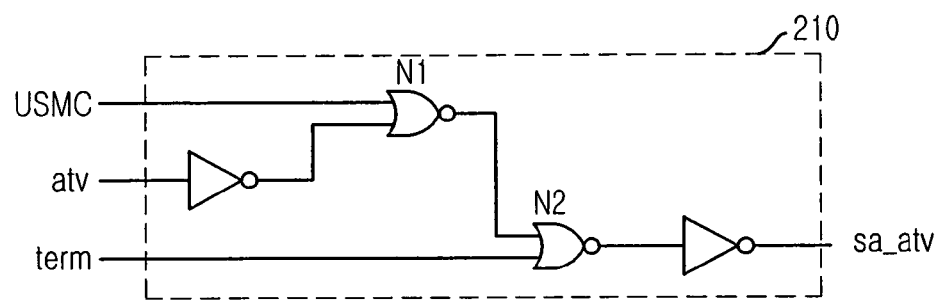
FIG. 3 is a USMC logic diagram in prior art.
Figure 4:
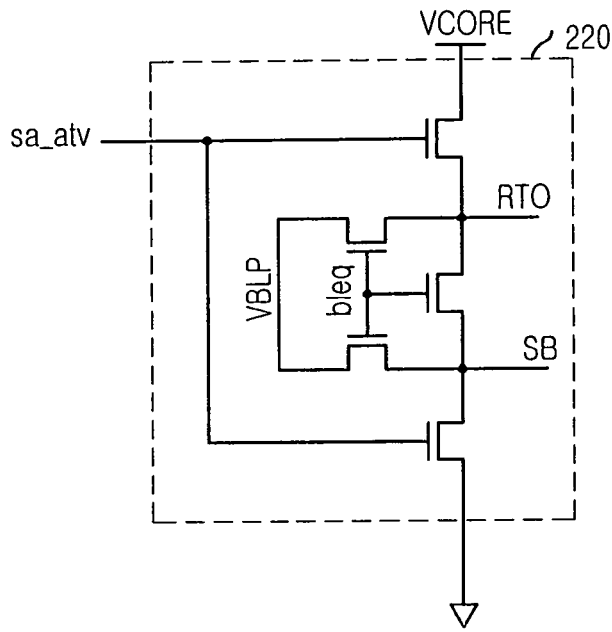
FIG. 4 is an exemplary diagram showing one embodiment of a generator for a RTO signal and an SB signal.
Figure 5:
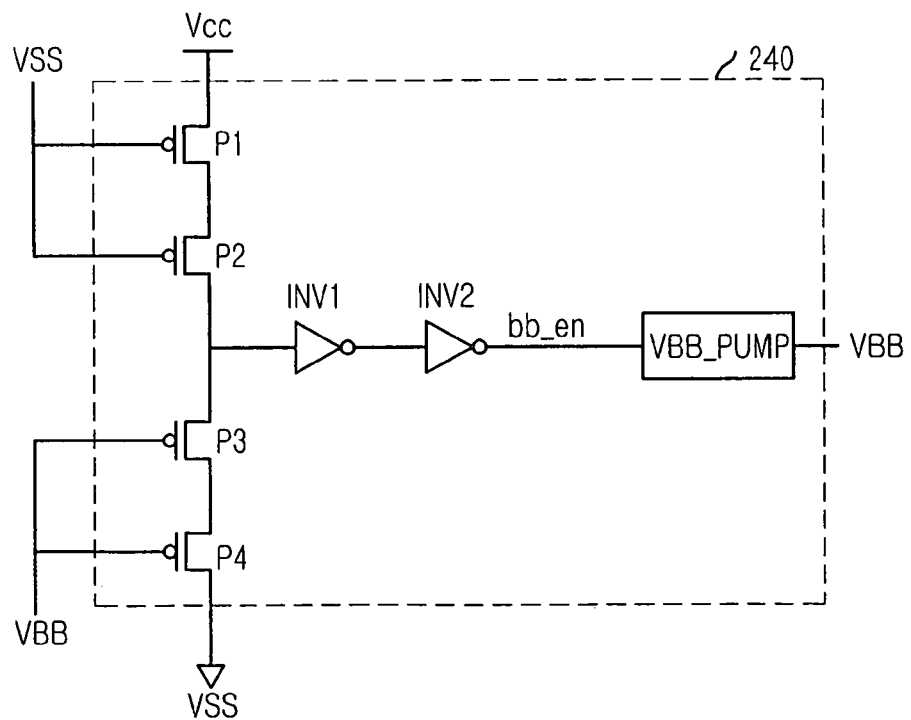
FIG. 5 is a diagram showing a VBB generator in prior art.
Figure 6:
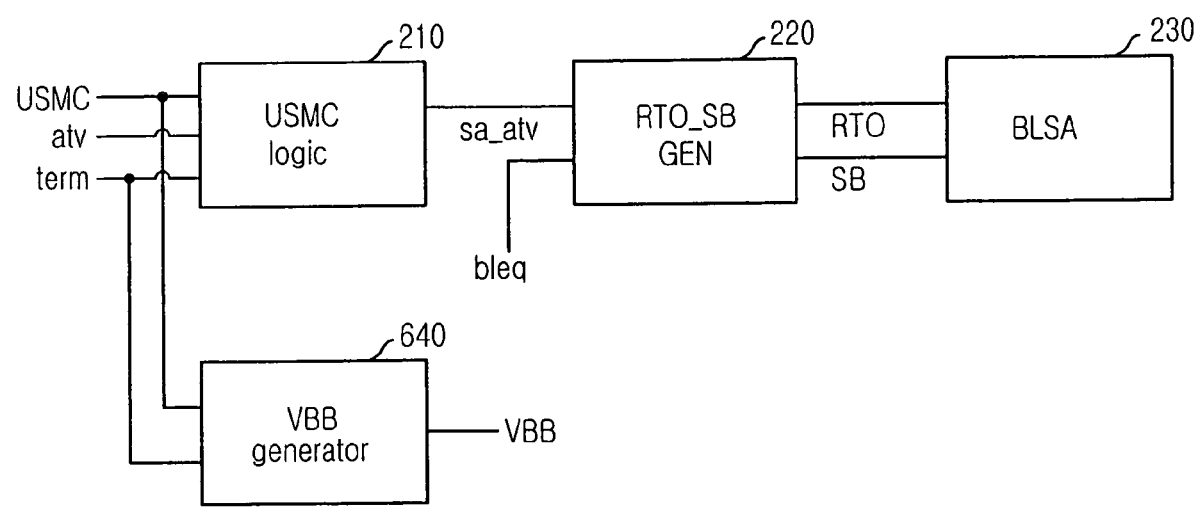
FIG. 6 is a schematic diagram for a USMC test in accordance with the present invention.

FIG. 6 is a schematic diagram for a USMC test in accordance with the present invention, which is similar to the conventional USMC test except that a bulk bias voltage VBB generator 640 further includes a bulk bias voltage adjusting unit to adjust a target level of the bulk bias voltage VBB by using a USMC signal and a termination signal term in a USMC test.

Figure 7:
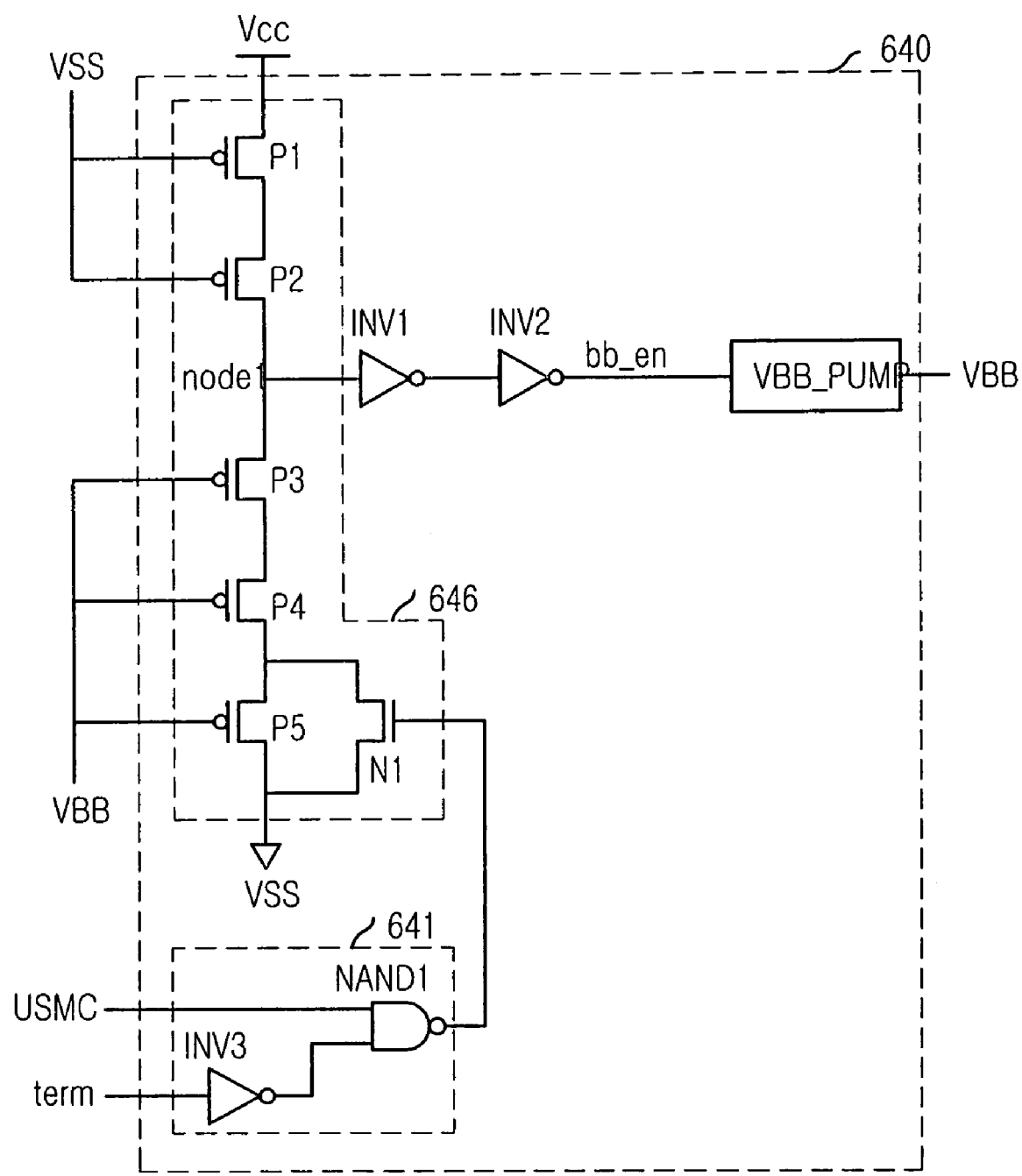
FIG. 7 is a circuit diagram showing a bulk bias voltage generator for a USMC test in accordance with one embodiment of the present invention.

FIG. 7 is a circuit diagram showing a bulk bias voltage generator for a USMC test in accordance with one embodiment of the present invention.

The bulk bias voltage generator for the USMC test according to one embodiment of the present invention includes the bulk bias voltage adjusting unit. The bulk bias voltage adjusting unit includes a control signal generating unit 641 for adjusting the level of the bulk bias voltage in the USMC test, and a resistor unit 646 for adjusting a resistance in response to the control signal from the control signal generating unit 641.

The control signal generating unit 641 includes an inverter INV3 receiving the termination signal term, and a NAND gate NAND1 receiving the output of the inverter INV3 and the USMC signal. The resistor unit 646 includes a PMOS transistor P5 between a PMOS transistor P4 and the ground voltage VSS, and a NMOS transistor N1 coupled parallel to the PMOS transistor P5 for using the output of the control signal generating unit 641 as its gate signal. It is desirable to use high resistance long channel PMOS transistors for the PMOS transistors P1–P5. On the other hand, in order to reduce the turn-on resistance of the NMOS transistor N1, it is desirable to use a transistor having a shorter channel length than the PMOS transistors P1–P5 as the NMOS transistor N1. It will be described for the operation of the bulk bias voltage generator.

In the normal operation, because both of the USMC signal USMC and the termination signal term are all "L" state, the output of the control signal generating unit 641 goes to the "H" state so as to make the NMOS transistor N1 turned on and, accordingly, the current that passed through the PMOS transistors P3, P4 passes through the NMOS transistor N1 without going through the PMOS transistor P5. At this time, the bulk bias voltage VBB generator operates as the conventional case.

On the other hand, In the USMC test, when the USMC signal USMC goes to the "H" state to make the output of the control signal generating unit 641 be the "L" state, the NMOS transistor N1 in the resistor unit 646 is turned off and, accordingly, the current that passed through the PMOS transistors P3, P4 goes through the PMOS transistor P5 to the ground voltage VSS. That is, in the USMC test, the resistance between the node node1 and the ground voltage is increased to make the voltage level on the node node1 increase. Accordingly, it makes the threshold point at which the inverter INV1 recognizes the "H" state be lower so as to have a lower the target level of the bulk bias voltage of the bulk bias voltage pump VBB_PUMP than the conventional target level.

To the contrary, when it is started to detect the bit line voltage when the USMC test is terminated, the termination signal term goes to the "H" state to make the output of the control signal generating unit 641 be the "H" state and, accordingly, the NMOS transistor N1 in the resistor unit 646 is turned on to let the bulk bias voltage generator 640 operate normally.

Figure 8:
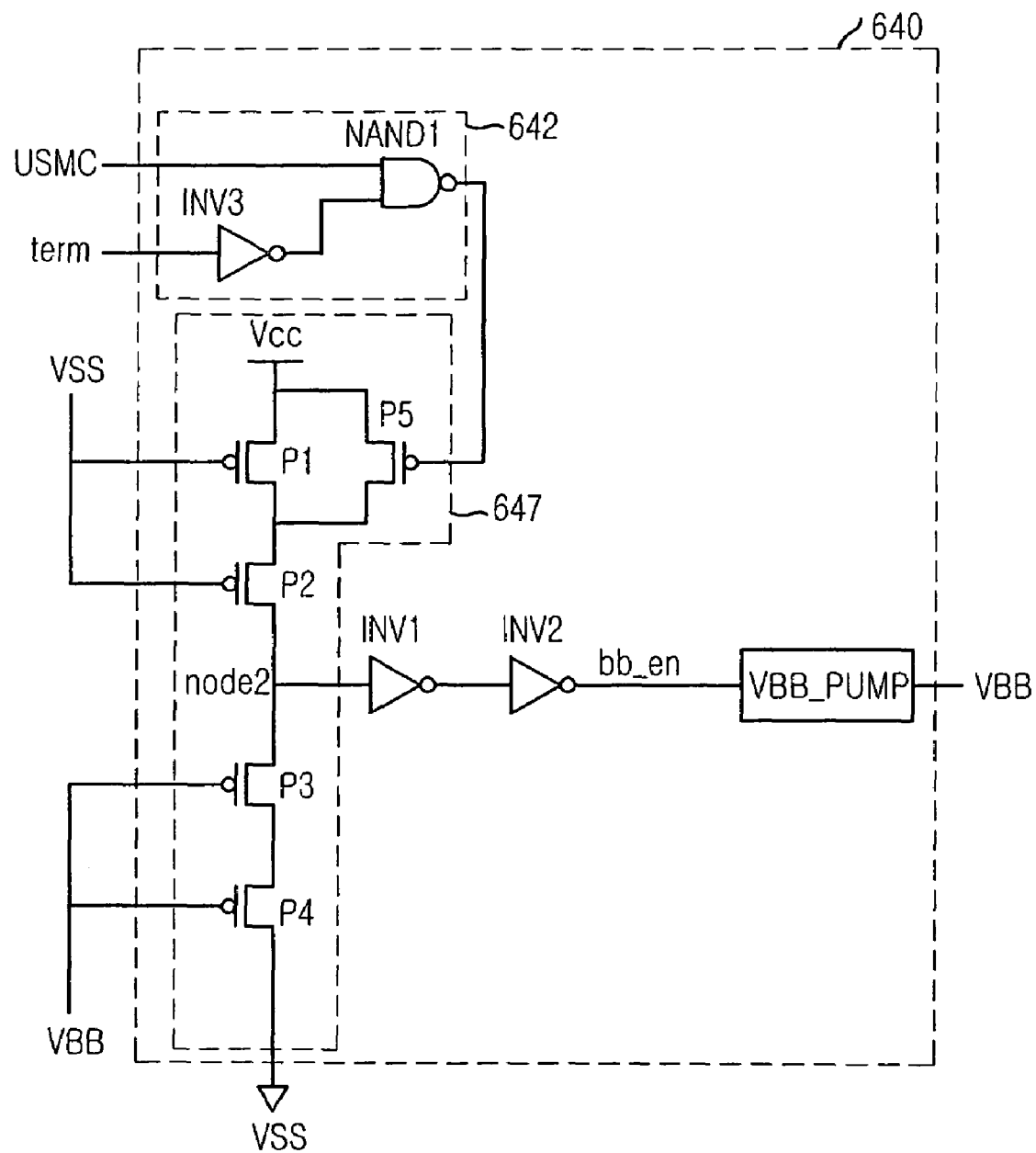
FIG. 8 is a circuit diagram showing a bulk bias voltage generator for a USMC test in accordance with another embodiment of the present invention.

FIG. 8 is a circuit diagram showing a bulk bias voltage generator for a USMC test in accordance with another embodiment of the present invention, which includes a bulk bias voltage adjusting unit.

The bulk bias voltage adjusting unit includes a control signal generating unit 642 for adjusting the level of the bulk bias voltage in the USMC test, and a resistor unit 647 for adjusting a resistance in response to the control signal from the control signal generating unit 642. Here, The bulk bias voltage adjusting unit in FIG. 8 is similar to the bulk bias voltage adjusting unit in FIG. 7 except that the PMOS transistor P5 in the resistor unit 647, which receives the output of the control signal generating unit 642 that is as same as the control signal generating unit 641 in FIG. 7, is coupled parallel to the PMOS transistor P1.

The operation of the bulk bias voltage generator as shown in FIG. 8 is similar to the operation of the bulk bias voltage generator as shown in FIG. 7.

In the normal operation, because both of the USMC signal USMC and the termination signal term are all "L" state, the output of the control signal generating unit 642 goes to the "H" state so as to make the PMOS transistor P5 be turned off.

In the USMC test, when the USMC signal USMC goes to the "H" state to make the output of the control signal generating unit 642 be the "L" state, the PMOS transistor P5 in the resistor unit 647 is turned on and, accordingly, the voltage level on the node node2 increase. Accordingly, it makes to reduce the target level of the bulk bias voltage VBB.

When the USMC test is terminated, the termination signal term goes to the "H" state to make the output of the control signal generating unit 642 be the "H" state and, accordingly, the bulk bias voltage generator 640 operates normally.

As described above, by making the level of the bulk bias voltage VBB reduced in the USMC test, the leakage component at the cell transistors that are coupled to the inactive word lines can be reduced. Further, because the bulk bias voltage VBB is applied to the bit line transistors or the transistors in the sense amplifier 230 as the bulk bias, the leakage component at this part can be suppressed.

On the other hand, the bulk bias voltage generators in FIGS. 7 and 8 are applicable to a negative voltage VBBW generator in which a negative voltage VBBW is generated to apply to the gates of the cell transistors coupled to the inactive word lines in a negative word line scheme. In other words, by using a negative voltage pump VBBW_PUMP instead of the bulk bias voltage pump VBB_PUMP, the leakage component at the cell transistors can be suppressed with those generators in FIGS. 7 and 8.

Further, the leakage component at the cell transistors can be suppressed by adjusting both of the negative voltage VBBW that is applied to the gates of the cell transistors in the negative word line scheme and the bulk bias voltage VBB that is applied to the substrates of the cell transistors.

Further, the leakage component at the cell transistors can be suppressed by changing the target level of the plate voltage VPP that is applied to the gates of the cell transistors that are coupled to the active word lines in the USMC test. In this case, the plate voltage VPP may be used as the bulk bias voltage of the RTO PMOS transistor of the sense amplifier so that the leakage component at the RTO PMOS transistor can be suppressed by adjusting the level of the plate voltage VPP.

As described above, the leakage component that is generated at the cell transistors in the USMC test can be suppressed according to the present invention. Further, the leakage component that is generated at the sense amplifier of the semiconductor memory device can be suppressed according to the present invention. Accordingly, the USMC test can be performed accurately.

The present application contains subject matter related to the Korean patent application No. KR 2004-40321, filled in the Korean Patent Office on Jun. 3, 2004, the entire contents of which being incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. A semiconductor memory device for improving reliability of a test which checks if data is normally transferred by extending a time margin between an active signal input time and a bit line sensing time, comprising:
   at least one inner voltage adjusting means for adjusting an inner voltage for limiting leakage portion that is generated in the semiconductor memory device during the test by using a test signal for starting the test and a termination signal for terminating the test.

2. The semiconductor memory device as recited in claim 1, wherein the inner voltage adjusting means includes a bulk bias voltage adjusting means for supplying a bulk bias voltage to a cell transistor in the semiconductor memory device.

3. The semiconductor memory device as recited in claim 1, wherein the inner voltage adjusting means includes a negative voltage adjusting means for supplying a negative voltage to a gate of a cell transistor that is coupled to an inactive word line in the semiconductor memory device using a negative word line scheme.

4. The semiconductor memory device as recited in claim 1, wherein the inner voltage adjusting means includes a plate voltage adjusting means for supplying a plate voltage to a gate of a cell transistor that is coupled to an active word line in the semiconductor memory device.

5. The semiconductor memory device as recited in claim 1, wherein the inner voltage adjusting means includes:
   bulk bias voltage adjusting means for supplying a bulk bias voltage to a cell transistor in the semiconductor memory device; and
   negative voltage adjusting means for supplying a negative voltage to the gate of the cell transistor that is coupled to an inactive word line of the semiconductor memory device.

6. The semiconductor memory device as recited in claim 2, wherein the bulk bias voltage adjusting means includes:
   control signal generating means for generating a control signal for adjusting the level of the bulk bias voltage in the test by using the test signal for starting the test and the termination signal for terminating the test; and
   resistor means for adjusting a resistance in response to the control signal that is outputted from the control signal generating means.

7. The semiconductor memory device as recited in claim 6, wherein the control signal generating means includes:
   an inverter receiving the termination signal for terminating the test; and
   a NAND gate receiving the test signal for starting the test and the output of the inverter.

8. The semiconductor memory device as recited in claim 6, wherein the resistor means includes:
   an upper resistor stage supplied with a positive voltage and controlled with a ground voltage for maintaining a fixed resistance; and
   a lower resistor stage coupled between the upper resistor stage and the ground voltage and controlled with the control signal for increasing the resistance in the test.

9. The semiconductor memory device as recited in claim 8, wherein the upper resistor stage includes a first and a second PMOS transistor serially coupled to each other.

10. The semiconductor memory device as recited in claim 9, wherein the lower resistor stage includes:
    a third to a fifth transistors serially coupled sequentially; and
    an NMOS transistor coupled parallel to one of the third to the fifth transistors.

11. The semiconductor memory device as recited in claim 10, wherein the channels of the PMOS transistors are longer than the channel of the NMOS transistor.

12. The semiconductor memory device as recited in claim 6, wherein the resistor means includes:
    an upper resistor stage supplied with a positive voltage and controlled with the control signal for decreasing the resistance in the test; and
    a lower resistor stage coupled between the upper resistor stage and a ground voltage and controlled with the bulk bias voltage.

13. The semiconductor memory device as recited in claim 12, wherein the upper resistor stage includes:
    a first and a second PMOS transistors serially coupled to each other and controlled with a ground voltage; and
    a fifth PMOS transistor controlled with the control signal and coupled parallel to one of the first and the second PMOS transistor.

14. The semiconductor memory device as recited in claim 13, wherein the lower resistor stage includes a third and a fourth PMOS transistors serially coupled to each other.

15. The semiconductor memory device as recited in claim 3, wherein the negative voltage adjusting means includes:
    control signal generating means for generating a control signal for adjusting the level of the negative voltage in the test by using the test signal for starting the test and the termination signal for terminating the test; and
    resistor means for adjusting the resistance in response to the control that is outputted from the control signal generating means.

16. The semiconductor memory device as recited in claim 15, wherein the control signal generating means includes:
    an inverter receiving the termination signal for terminating the test; and
    a NAND gate receiving the test signal for starting the test and the output of the inverter.

17. The semiconductor memory device as recited in claim 15, wherein the resistor means includes:
    an upper resistor stage supplied with a positive voltage and controlled with a ground voltage for maintaining a fixed resistance; and
    a lower resistor stage coupled between the upper resistor stage and the ground voltage and controlled with the control signal for increasing the resistance in the USMC test.

18. The semiconductor memory device as recited in claim 17, wherein the upper resistor stage includes a first and a second PMOS transistors serially coupled to each other.

19. The semiconductor memory device as recited in claim 18, wherein the lower resistor stage includes:
    a third to a fifth transistors serially coupled sequentially; and
    an NMOS transistor coupled parallel to one of the third to the fifth transistors.

20. The semiconductor memory device as recited in claim 19, wherein the channels of the PMOS transistors are longer than the channel of the NMOS transistor.

21. The semiconductor memory device as recited in claim 15, wherein the resistor means includes:

an upper resistor stage supplied with a positive voltage and controlled with the control signal for decreasing the resistance in the test; and a lower resistor stage coupled between the upper resistor stage and a ground voltage and controlled with the negative voltage.

22. The semiconductor memory device as recited in claim 21, wherein the upper resistor stage includes:

a first and a second PMOS transistors serially coupled to each other and controlled with a ground voltage; and a fifth PMOS transistor controlled with the control signal and coupled parallel to one of the first and the second PMOS transistor.

23. The semiconductor memory device-as recited in claim 22, wherein the lower resistor stage includes a third and a fourth PMOS transistors serially coupled to each other.

24. The semiconductor memory device as recited in claim 1, wherein the inner voltage adjusting means includes a bulk bias voltage adjusting means for supplying a bulk bias voltage to a PMOS transistor that drives an RTO signal output stage of a sense amplifier.

25. A method for adjusting an inner voltage in a semiconductor memory device for improving reliability of a test which checks if data is normally transferred when time variance between an active signal input time and a bit line sensing time is set to be longer than a normal case, comprising:

a) generating a control signal by using a test signal for starting the test and a termination signal for terminating the test; and b) adjusting the inner voltage under control of the control signal to limit leakage portion that is generated in the semiconductor memory device during the test.

* * * * *